(12) United States Patent
Otsuki et al.

(10) Patent No.: US 6,388,535 B1
(45) Date of Patent: May 14, 2002

(54) OSCILLATOR, AND AN OSCILLATOR CHARACTERISTIC ADJUSTMENT METHOD

(75) Inventors: Terukazu Otsuki, Nara; Masumi Nakamichi, Tenri; Hiroshi Isoda, Nara; Masakazu Ikeda, Kyoto, all of (JP)

(73) Assignee: Sharp Kabushiki Kaisha, Osaka (JP)

( * ) Notice: Subject to any disclaimer, the term of this patent is extended or adjusted under 35 U.S.C. 154(b) by 0 days.

(21) Appl. No.: 09/552,620

(22) Filed: Apr. 19, 2000

(30) Foreign Application Priority Data

Apr. 19, 1999 (JP) ............................................. 11-111084
Sep. 2, 1999 (JP) ............................................. 11-248984

(51) Int. Cl.$^7$ ................................................. H03B 5/18
(52) U.S. Cl. .............................. 331/177 R; 331/108 C; 331/108 D; 331/36 L; 331/99
(58) Field of Search ........................... 331/96, 99, 36 L, 331/177 R, 108 D, 117 D, 108 C; 333/246

(56) References Cited

U.S. PATENT DOCUMENTS 5,087,896 A * 2/1992 Wen et al. .................... 331/99

FOREIGN PATENT DOCUMENTS

| JP | A888527 | 4/1996 |
|----|---------|--------|
| JP | A10150308 | 6/1998 |
| JP | A1168459 | 3/1999 |

* cited by examiner

Primary Examiner—Arnold Kinkead

(57) ABSTRACT

A smaller oscillator module enables oscillation frequency to be adjusted from the back after assembly is finished. The oscillator has oscillator circuit components mounted on the front of a circuit board having an internal dielectric layer, a back conductor layer covering a major part of the back of the circuit board, and at least a part of an inductor element of the oscillator circuit disposed internally with a part of an intervening dielectric layer from the back conductor layer. A slit or pinhole is formed in the back conductor. The oscillation frequency can then be adjusted after assembly is completed by emitting a trimming laser through this slit or pinhole to change the inductance by partially removing the dielectric layer and inductor element.

23 Claims, 11 Drawing Sheets

OSCILLATOR, AND AN OSCILLATOR CHARACTERISTIC ADJUSTMENT METHOD

CROSS-REFERENCE TO RELATED APPLICATION

This application is related to Japanese applications No. HEI 11(1999)-111084 filed on Apr. 19, 1999 and No. HEI 11(1999)-248984 filed on Sep. 2, 1999, whose priorities are claimed under 35 USC §119, the disclosure of which is incorporated by reference in its entirety.

BACKGROUND OF THE INVENTION

1. Field of the Invention

The present invention relates to an oscillator and to a method for adjusting the oscillation characteristics of the oscillator. More specifically, the present invention relates to a small oscillator used in mobile telephones, mobile data terminals, wireless LAN transmitter/receivers, satellite communications terminals, GPS receivers and other types of wireless communication devices operating at a high frequency band, and to a method for adjusting the oscillation characteristics of the oscillator. An oscillator according to this invention is well suited to reducing the size of a module that is a major component of the oscillator used particularly in high frequency applications operating at hundreds of megahertz and higher.

2. Description of Related Art

As terminal devices for high frequency communication systems, such as mobile telephones, have gotten smaller, so have oscillation circuit modules, such as voltage control oscillators (VCO), which are one kind of high frequency components used in such terminal devices.

The characteristics of individual components and variations in wiring pattern dimensions in substrates cannot be ignored in such small oscillation modules for high frequency applications, particularly at frequencies of hundreds of megahertz and higher. It is therefore necessary in practice to adjust each individual module so that the oscillation frequency, for example, is within a specific design range.

One method used for this adjustment as taught in Japanese Unexamined Patent Application (kokai) 6-13807 is to adjust an inductor part of an oscillation circuit by changing the length and/or width of a conductor pattern. This is accomplished by cutting a part of a circuit pattern formed on a component mounting surface of a circuit board by mechanical means, such as sandblasting, or optical means, such as a laser. Other methods seeking to achieve an even smaller module by means of a multilayer circuit board provide a part of an inductor (see Japanese Patent 2662748) or capacitor (see Japanese Patent 2531000) of the oscillation circuit in circuit board layers.

FIGS. 17 and 18 show an exemplary oscillator in which an inductor part of an oscillator is drawn to a circuit board surface. As shown in, FIG. 17, a back ground conductor 22, an internal ground conductor 23 and an inductor conductor 24 of a strip line between the conductors 22 and 23 are formed within a printed circuit board 21, forming a tri-plate structure. A part of the strip line inductor conductor 24a is connected through a through hole 25 to a conductor pad 24b mounted on the substrate surface. The electrical length of the inductor can then be changed by appropriately trimming this surface conductor pad 24b on the substrate surface as shown at notch 26 in FIG. 18, thereby adjusting inductance to vary oscillator characteristics such as oscillation frequency.

Another adjustment method is illustrated in FIG. 19. As shown in this section view of an oscillator, a capacitor part of the oscillator is formed inside a substrate, and one electrode of the capacitor electrode disposed on the substrate surface is trimmed to adjust capacitance as a means of adjusting oscillator characteristics. In this example, an inductor part of a resonance circuit is incorporated as a strip line 24 of the tri-plate structure inside a printed circuit board 21 as in the above example, and one end of the inductor is exposed via a through hole 25 on to the surface 27 as a surface electrode 28. That is, a capacitor parallel-connected to the inductor and forming a resonance circuit is mounted within the circuit board with the surface electrode 28 opposed to the internal ground conductor 23 with intervention of the dielectric circuit board. The surface electrode 28 is trimmed to adjust the electrode surface area, and thereby adjust capacitance, that is, adjust the oscillator.

In the above-described prior-art examples, while part of the circuit is formed inside the circuit board so as to reduce device dimensions, both the methods also expose part of the internal conductor pattern on the component mounting surface of the circuit board so that the exposed part (part 24b in FIG. 17, and part 28 in FIG. 19) is trimmed, to adjust oscillator module characteristics. This method of internalizing part of the circuit as a means of reducing size is therefore the same as methods in which parts are not internalized in that a trimming pad occupies a certain amount of area on the component mounting surface.

A metal shield cap covering the component mounting surface is provided for most such modules to protect the mounted components and prevent electromagnetic interference with neighboring parts. This shield cap can be mounted either before or after adjusting the oscillator.

When the shield cap is installed after trimming a circuit component on the component mounting surface of the circuit board to adjust the oscillator, the adjustment must be accomplished to anticipate any shift in characteristics resulting from the later addition of the shield cap. If the shield cap is installed before the adjustment, a laser can be used for trimming through a trimming slit or hole provided in the shield cap, and the trimming slit or hole is then sealed with a conductive sealant.

In the former method, trimming must allow for any shift in the oscillator frequency or other module characteristics resulting from the shield cap. As noted above, however, because variations in characteristics of individual modules are great, the adjustment is not possible with a uniform offset, and the precise adjustment is not possible with this method.

In the latter method, dust and debris from the trimmed part become trapped inside the shield cap because trimming is accomplished after the shield cap is mounted. Such dust and debris can easily adhere to surrounding parts, resulting in a possible loss of reliability.

One possible method of resolving this problem is to draw an internal conductor to the back side of a circuit board for trimming. In this case, however, a trimming pad must be provided, and this occupies some area on the back of the circuit board. This makes it difficult to shield the back of a module. A shield cap such as provided on the front surface of the circuit board must therefore be provided. This method is therefore not practical for applications seeking to downsize the module.

Another oscillator adjustment method proposing a solution to this problem is taught in Japanese Unexamined Patent Application (kokai) 9-153737. This method accomplishes laser trimming perpendicular from the back of a circuit board to the inside to adjust electrode area of a multilayer internal capacitor.

FIG. 20 is a section view of a module in this method. In this module a capacitor 27 of a resonance circuit is internalized in a circuit board by stacking electrodes 27a and 27b with a dielectric layer of the circuit board therebetween. As indicated by an arrow 28 in FIG. 21, laser trimming perpendicular to and from the back of the module adjusts the area of the electrodes 27a and 27b of the internal capacitor 27, and thus adjusts the module.

While this method solves the surface area problem described above, an electrode structure of a capacitor must be a multilayer structure comprising at least three or four layers in order to achieve a sufficient capacitance adjustment range. The result is a multilayer circuit board, increasing circuit board thickness and cost.

Furthermore, YAG lasers are typically used for trimming because they can produce a necessary power and can gather light to a spot of several ten micrometers or more. On the other hand, the fundamental wavelength of a YAG laser is 1.06 µm. As shown in FIG. 22, reflectivity at this wavelength is extremely high with copper and other metals used for conductors to be trimmed, necessitating even more power for trimming. The result is that a circuit board is easily overtrimmed to the back side of the conductor being trimmed, thus lowering insulation properties as a result of partial carbonization, and making it difficult to achieve a desired trimming effect. Furthermore, when the conductor imbedded in a dielectric must be trimmed together with the dielectric as in the above-noted method, it is difficult to appropriately adjust the laser power to achieve the desired trimming.

SUMMARY OF THE INVENTION

With consideration for the above problems, an object of the present invention is therefore to provide a compact, high performance, high reliability oscillator (module) having a structure which allows an internal conductor pattern constituting primarily a resonance circuit inductor to be trimmed directly from the back of a circuit board. A further object of the invention is to provide a high density adjustment method for said oscillator (module).

To achieve the above objects, the present invention provides an oscillator which comprises: a circuit board having a dielectric layer therein; an oscillator circuit comprising its components and an inductor element, the components being mounted on the front surface of the circuit board and at least a part of the inductor element being internally disposed in the dielectric layer; and a back conductor covering a major part of the back surface of the circuit board; wherein the back conductor has a slit or pinhole which allows the dielectric layer and the internally disposed part of the inductor element to be partially cut by a laser beam passing through the slit or pinhole for adjustment of an oscillator characteristic.

In other words, the present invention provides the slit or pinhole in the back conductor covering the major part of the back surface of the circuit board. A part of the internal inductor element is then cut out (trimmed) by emitting a laser beam through this slit or pinhole to burn out a part of the inductor element (to form a conductive pattern) together with the dielectric layer intervening between the back conductor and said inductor element. A desired oscillator characteristic is thus achieved.

DESCRIPTION OF THE PREFERRED EMBODIMENTS

Figure 1:
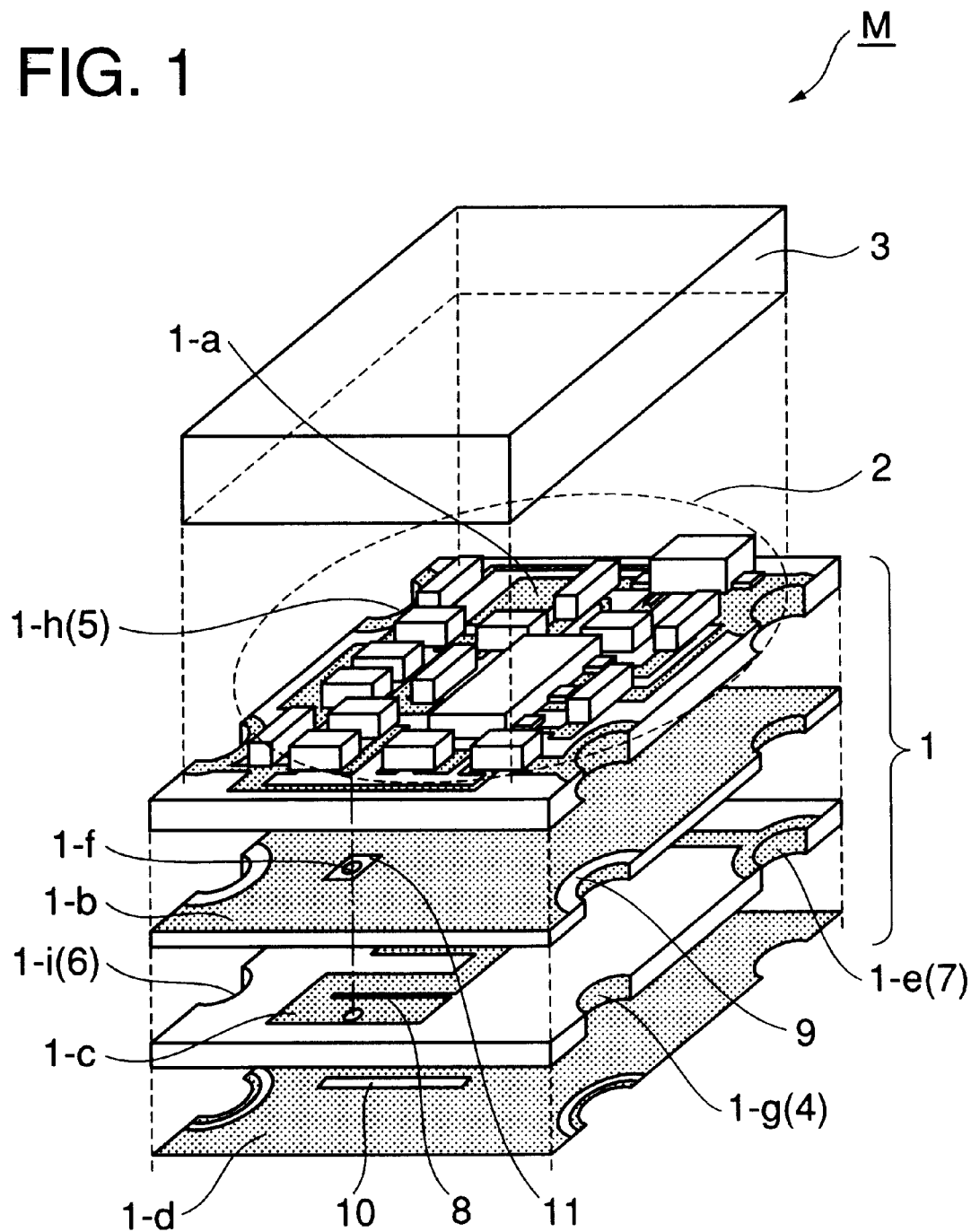
FIG. 1 is a partially exploded perspective view of a voltage control oscillator (VCO) in accordance with Embodiment 1 of the present invention.

The width of the slit for passing a laser beam is preferably two or more times a diameter of an emitted laser spot, and more preferable slit width is between two and three times said spot diameter. The pinhole diameter is also preferably at least twice the emitted laser spot diameter.

The dielectric layer of the circuit board according to the present invention is preferably composed primarily of an organic material such as a glass-reinforced epoxy resin, an aramid resin or the like, which has a melting point of several hundred °C. or less. When thus composed, a target area of the dielectric layer can be easily burned out by the emitted laser for trimming (trimming laser). Trimming efficiency is thus improved. The trimming laser also melts resin used for the dielectric layer immediately surrounding the target area, and after the trimming laser is stopped, the molten resin flows over and covers the top of the inductor element(as seen from the slit on the circuit board back). As a result, lowering of moisture resistance can be prevented.

According to the invention, a trench or depression can be further formed in the dielectric layer positioning at the slit or pinhole formed in the back conductor (such as the ground conductor). In this case, the dielectric layer is thinner inside the slit or pinhole compared to the remaining part of the dielectric layer. This makes it even easier to burn out the dielectric layer above the inductor element on the inner side of the slit during trimming. Since trimming efficiency is thus yet further improved, ceramics and other dielectric materials requiring a high energy level to burn out can be used, and made from a wider selection of materials.

The inductor element can also be colored at least in the target area for trimming to increase absorption at the wavelength of the laser used for trimming. Reflection of the laser beam by the inductor element is thus reduced so that trimming can be accomplished using a less powerful laser. This also makes it easier to optimally adjust laser power to a level at which the inductor element and the dielectric layer at the target area can be burned out in one step, and overtrimming to the side of the inductor element opposite the trimming slit can also be avoided.

Particularly, coloration may be one generally applied in this field, for example a portion to be trimmed in the inductor element can be blackened by pre-oxidation process.

Yet further preferably, a laser blocking conductor (or second conductor layer) is internally disposed at least in line with a path of the laser beam through the slit or pinhole, this laser blocking conductor being disposed between the target area of the inductor element and the front (component mounting surface) of the circuit board. In this case the slit or pinhole is provided in the back of the circuit board at a position overlapping a specific trimming point of the inductor element. It is therefore possible to position the trimming laser to the inductor element that can not be seen directly from the surface by targetting this slit or pinhole.

Furthermore, even if the trimming laser incident through the slit or pinhole hits an area where the inductor element is not present, such as near the trimming starting point, overtrimming to the circuit board front (a side opposite to a laser incidence side) can be prevented by the blocking conductor. Damage to a wiring pattern on the component mounted surface of the circuit board, as well as to components mounted thereon, can thus be prevented.

The effect on oscillator performance can be further reduced by making the second conductor layer thicker than the inductor element. As a result, more power is required to puncture this second conductor layer than to burn through the inductor element layer; the second conductor layer is also positioned deeper than the inductor element from the laser incidence surface. If trimming laser power is appropriately set so that trimming in a depth direction goes through the inductor element and stops at a part of the dielectric layer directly below the inductor element, the second conductor layer will not be punctured even at the target and other points where the inductor element is not present, and the effect on oscillator performance can therefore be minimized.

It is yet further preferable for the second conductor layer to be electrically isolated from the oscillator circuit, including particularly the back conductor layer of the circuit board, to further reduce potential adverse effects on oscillator performance, should accident occur. That is, if trimming advances depthwise from a particular part of the near inductor element and reaches the second conductor layer, carbonized resin remains around the burned out part, particularly when the dielectric layer below the inductor element is a resin or other organic material. This carbonized resin acts as a conductor, and electrical shorting can occur around the trimmed area between the second conductor layer and inductor element. Should this happen, however, the effect on oscillator performance can be minimized because the second conductor layer directly below the trimmed part is electrically isolated from the back conductor and other parts of the oscillator circuit pattern.

If the width of the slit or the diameter of the pinhole for letting through the laser beam is not significantly larger than the diameter of the laser beam spot, carbonized resin can produce shorting between the inductor element and the slit or pinhole edge at the back of the circuit board, in the burned out part even if the part is a dielectric part before reaching the inductor element. However, because the slit width or pinhole diameter is at least twice the laser spot diameter, there is more space between the removed part and the slit or pinhole, and the danger of such shorting can thus be reduced.

Yet further, if the area on the circuit board back where the slit or pinhole is formed is electrically isolated from all other circuits, including other ground areas (ground conductors) of the oscillator, the effect on oscillator performance can be minimized even if the slit or pinhole edge shorts to part of the inductor element.

It is yet further possible to suppress a rise in temperature during the trimming process by emitting the laser while contacting a heat sink (that is, a heat absorbing or dissipating member or device for suppressing a rise in temperature) to the back conductor on the circuit board near the slit or pinhole through which the laser is emitted. By thus suppressing the rise in temperature, it is possible to prevent damage resulting from melting the dielectric layer around the laser emission zone, or melting solder joints for fixing shield cap as a result of heat transfer from the back conductor of the circuit board.

The present invention also provides a method for adjusting an oscillation characteristic of an oscillator comprising, a circuit board having a dielectric layer therein; an oscillator circuit comprising its components and an inductor element, the components being mounted on the front surface of the circuit board and at least a part of the inductor element being disposed in the dielectric layer; and a back conductor covering a major part of the back surface of the circuit board; the method comprising the steps of forming beforehand a slit or pinhole in the back conductor and partially cutting the dielectric layer and the internally disposed part of the inductor element by a laser beam through the slit or pinhole.

This oscillator adjustment method can trim the inductor element primarily forming an inductance component of the oscillation circuit without exposing part of this inductor element to the circuit board surface. More specifically, this method can trim the inductor element by emitting a trimming laser through the slit or pinhole in the back conductor (for example, a ground conductor) to change the length and width of the inductor element, thereby adjusting the inductance to achieve a desired oscillation frequency or other oscillator characteristic.

A sufficient, change in inductance can also be achieved by thus adjusting the length or width of the inductor element, thus making a multilayer trimming electrode unnecessary. Oscillator adjustment is therefore possible using a thin circuit board.

The method of the invention also trims the inductor element after covering the component mounting surface of the circuit board with a shield cap. Problems for shift of adjustment point arising from installing the shield cap after trimming are thus eliminated, and high precision adjustment can be achieved.

Figure 13:
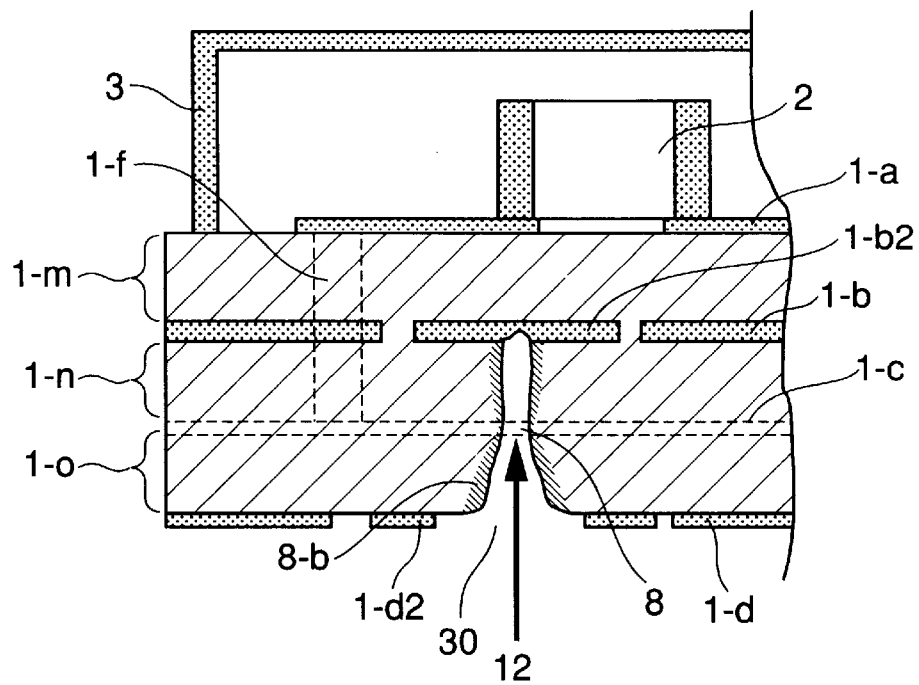
FIG. 13 is an enlarged section view (C–C' section view of FIG. 10) of a trimming target area of the printed circuit board in accordance with Embodiment 2 of the present invention.

The oscillator adjustment method of the invention yet further preferably uses for the above trimming step the second or higher harmonic wave of a YAG laser, obtained by passing the fundamental wave through a nonlinear optical element. A laser beam with a wavelength of, for example, ½ or ⅓ the fundamental wavelength (1.06 $\mu$m) of a YAG laser can therefore be used for trimming. As a result, laser beam absorption by the target area of inductor element can be improved as shown in FIG. 13; less power is needed for trimming; and laser power can be easily set to an optimum level whereby the inductor element and the dielectric layer between the inductor element and the trimming slit or pinhole on the circuit board back can be removed at once together, and overtrimming to the side of the inductor element opposite the slit or pinhole can be avoided.

Yet further preferably, the trimming laser is emitted through the slit or pinhole to partially remove at least a part of the inductor element while holding a heat sink in contact with the back conductor on the circuit board near the slit or pinhole through which the laser is emitted. This suppresses a rise in temperature in conjunction with the trimming process, and thereby prevents damage resulting from melting the dielectric layer around the laser emission zone, or melting shield cap solder joints as a result of heat transfer from the back conductor of the circuit board.

The present invention, from another viewpoint, further provides an oscillator which comprises: a circuit board having a dielectric layer therein, an oscillator circuit comprising its components and an inductor element, the components being mounted on the front surface of the circuit board and at least a part of the inductor element being internally disposed in the dielectric layer; and a back conductor covering a major part of a back surface of the circuit board; wherein the back conductor has a slit or pinhole and a part of the inductor element is removed together with the dielectric layer by a laser beam passing through the slit or pinhole for adjustment of an oscillator characteristic.

Other objects and attainments together with a fuller understanding of the invention will become apparent and appreciated by referring to the following description and claims taken in conjunction with the accompanying drawings.

The preferred embodiments of the present invention are described below with reference to the accompanying figures.

Embodiment 1

Figure 2:
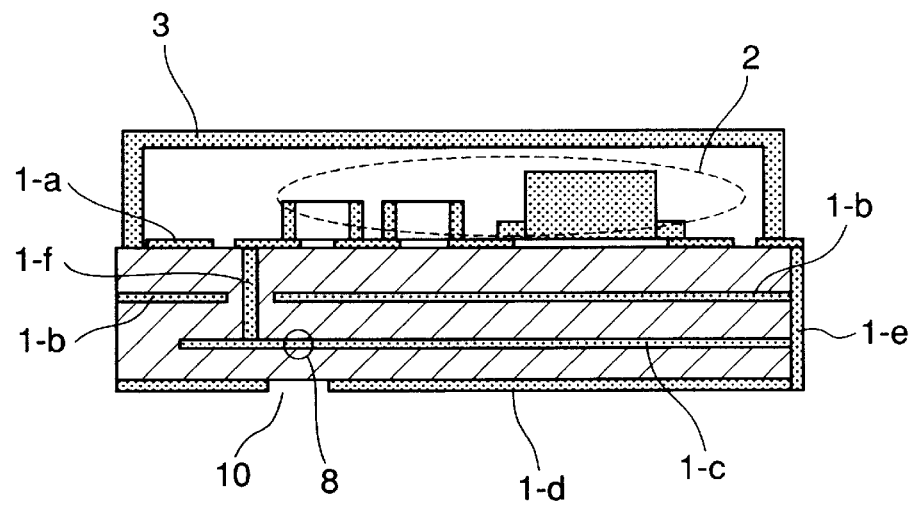
FIG. 2 is a section view of the voltage control oscillator of FIG. 1.

A voltage control oscillator (VCO) having an internal conductor pattern (an inductor element) is shown in partially exploded perspective view in FIG. 1 as a first preferred embodiment of the present invention. FIG. 2 is a section view of the same.

As shown in FIG. 1 and FIG. 2, this VCO module M comprises surface mounted components 2 including chip resistors, chip capacitors, transistors, variable capacitor diodes and the like mounted by reflow soldering as oscillation circuit components on the surface of a glass-reinforced epoxy resin copper printed circuit board 1 and covered by a shield cap 3 made from shaped metal sheet.

The circuit board 1 is a multilayer circuit board having four layers: a front conductor pattern surface (layer) 1-$a$ to which the surface mounted components are mounted, and an internal strip line of the tri-plate structure conductor pattern layer 1-$c$ disposed between an internal ground conductor layer 1-$b$ and a back ground conductor layer (a back conductor) 1-$d$.

The thickness of the conductor pattern is approximately 10 $\mu$m to 30 $\mu$m. The substrate (dielectric layer of glass-reinforced epoxy) between the front conductor pattern surface 1-$a$ and internal ground conductor layer 1-$b$ and the substrate between the internal conductor pattern layer 1-$c$ and back ground conductor layer 1-$d$ are each approximately 150 $\mu$m thick. The substrate (dielectric layer of glass epoxy) between the internal ground conductor layer 1-$b$ and internal conductor pattern layer 1-$c$ is approximately 200 $\mu$m.

One end of the internal conductor pattern layer 1-$c$ is disposed at a side of the circuit board, and is grounded by means of a conductor 1-$e$ disposed to the inside wall of a notch (half a through-hole) connecting the conductor pattern surface 1-$a$, internal ground conductor layer 1-$b$ and back ground conductor layer 1-$d$. The other end of the internal conductor pattern layer 1-$c$ is electrically connected by means of a via member 1-$f$ to the surface conductor pattern 1-$a$ through the middle of a window 11 disposed by cutting away a part of the internal ground conductor layer 1-$b$ thereabove.

In addition to the above connections, a Vcc terminal 4, a control terminal 5, and a RF output terminal 6 on the conductor pattern surface 1-$a$, that is, the wiring pattern on the circuit board top, are wired to the circuit board back by way of conductors 1-$g$, 1-$h$, and 1-$i$ disposed to the inside wall of notches (half through holes) in the circuit board side.

Figure 3:
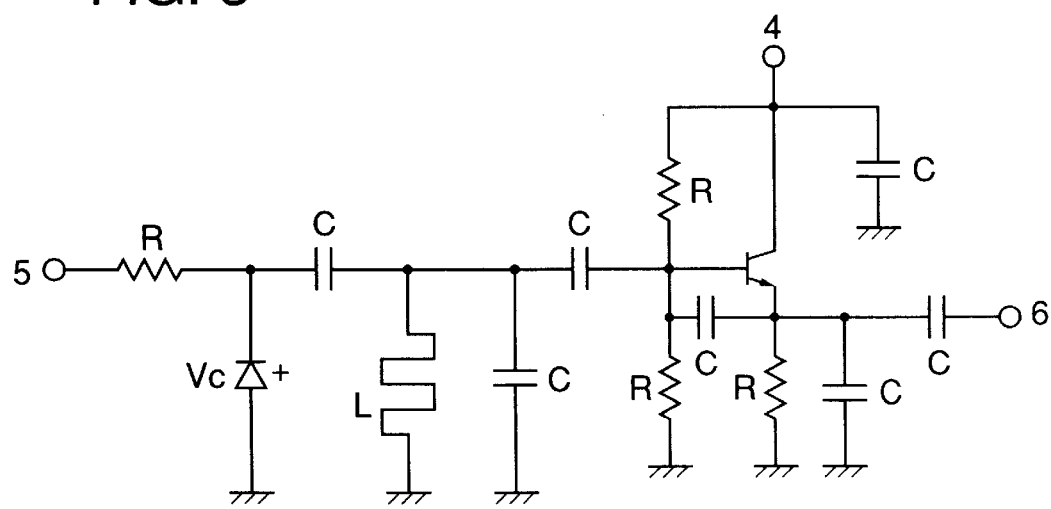
FIG. 3 is a circuit diagram of the voltage control oscillator of FIG. 1.

FIG. 3 is a circuit diagram of this VCO module M.

A transistor Tr, a resistor R, a variable capacitance diode Vc, and a capacitor C in the VCO module M shown in FIG. 3 are surface mounted components 2 mounted on the surface of the above-noted printed circuit board 1. An inductor L of the oscillation circuit is achieved primarily by the internal strip line conductor pattern layer 1-$c$ disposed as part of the tri-plate structure inside the circuit board.

This VCO module M changes the capacitance of the variable capacitance diode Vc, and changes the oscillation frequency of a RF signal obtained from RF output terminal 6, by controlling a voltage applied to the control terminal 5 shown in FIG. 3.

However, the oscillation frequency of each individual module varies as a result of differences in the characteristics of individual circuit elements, variations in printed circuit board dimensions, and variations in physical conditions when components are mounted. Therefore, to enable the variable capacitance diode to achieve the design oscillation frequency range by applying a specific control voltage, the inductance of the inductor L disposed as the inductance element of the oscillation circuit is adjusted for each module during the module manufacturing process.

The inductance of the inductor L is adjusted by adjusting the length and width of the internal conductor pattern layer 1-$c$ forming the inductor L.

Figure 4:
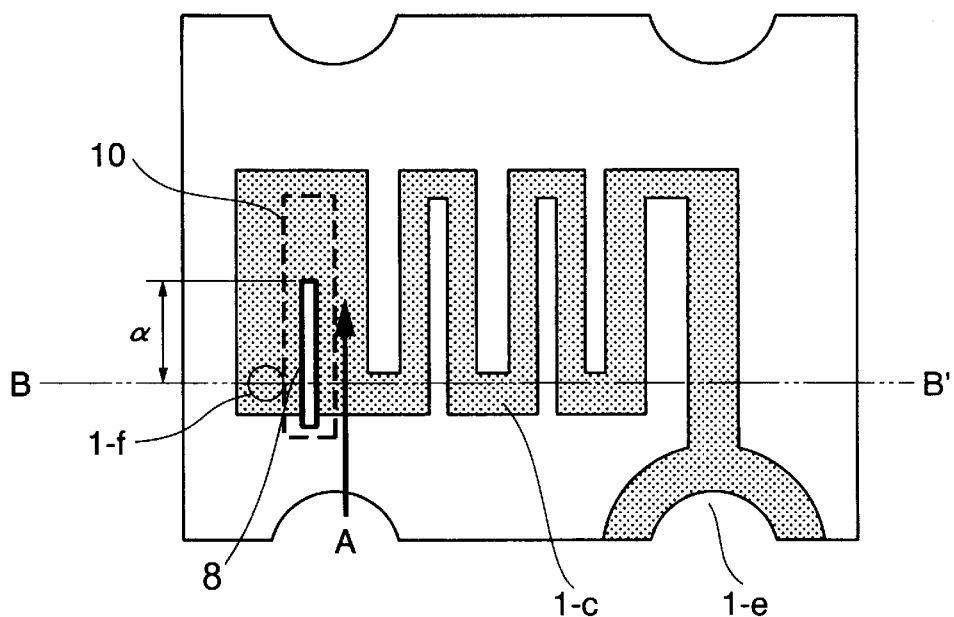
FIG. 4 is a plan view of an internal conductor pattern layer in a printed circuit board used for the voltage control oscillator of FIG. 1.

FIG. 4 is a plan view of the internal conductor pattern layer 1-$c$ in this exemplary embodiment of the invention from the surface side of the VCO module M. Note that the conductor 1-$e$ side of the internal conductor pattern layer 1-$c$ in the circuit board notch is grounded by way of the circuit board side, and the internal conductor pattern layer 1-$c$ is further connected to other oscillator components 2 mounted on the circuit board surface by way of the via member 1-*f*.

The electrical length of this conductor can be increased by approximately 2α, and the conductor width can be decreased, by trimming the conductor at the part indicated by the bold line 8 in FIG. 4. The inductance of an inductor comprising a parallel grounded conductor of a distributed constant high frequency circuit can be increased by increasing the electrical length or narrowing the width of the inductor. In this embodiment of the invention, therefore, the initial oscillation frequency of the module is set to a level higher than the design frequency and the inductor is not pretrimmed. The inductor is then trimmed at part 8 shown in FIG. 4 to greatly change the inductance of the inductor L of the oscillator as required to lower the oscillation frequency and thereby adjust the module to the desired oscillation frequency.

Figure 10:
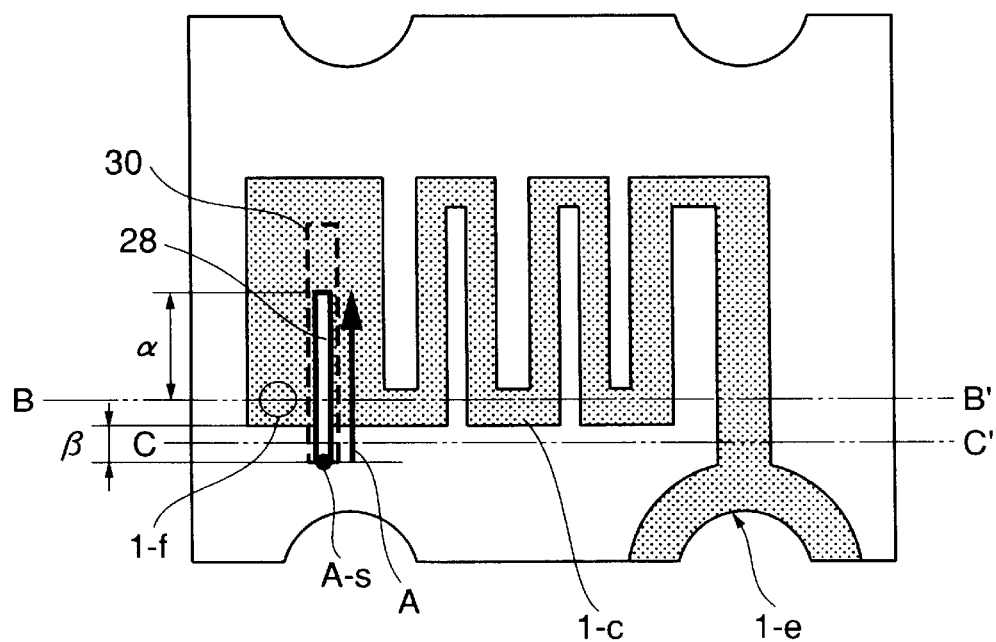
FIG. 10 is a plan view of an internal conductor pattern layer in a printed circuit board used for the voltage control oscillator of FIG. 8.

In this exemplary embodiment of the invention, the part of inductor removed by trimming has a width of approximately several ten micrometers, and the length is trimmed 0 to 1 mm as indicated by 28 in FIG. 10.

Figure 5:
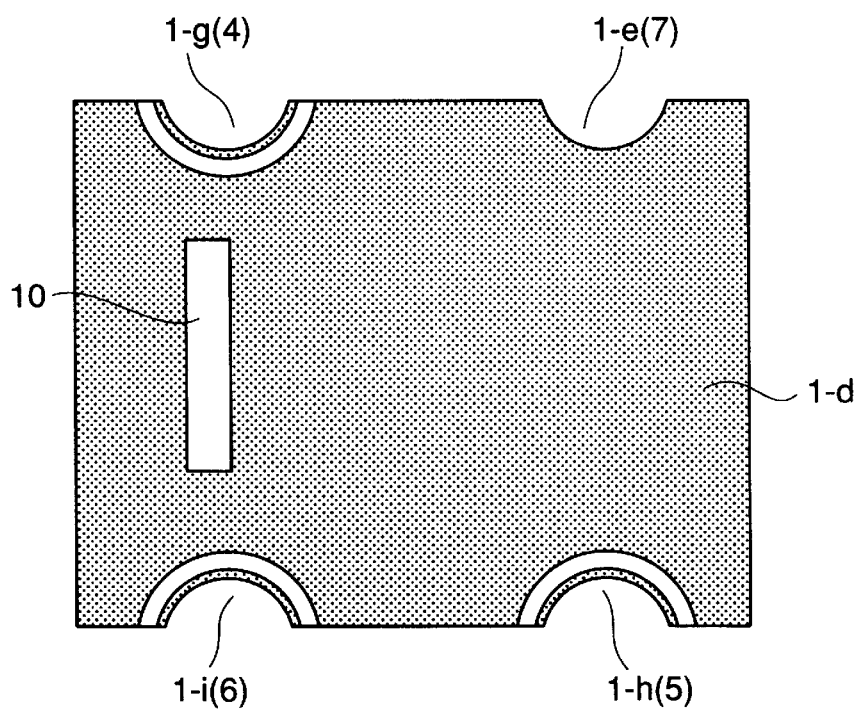
FIG. 5 is a bottom view of the printed circuit board of FIG. 4.

FIG. 5 is a plan view of this VCO module M from the back. Except for the Vcc terminal 4, control terminal 5, RF output terminal 6, and surrounding dielectric bands 9, the major part of the back is covered by the ground conductor layer 1-*d*. Note, further, a 300 μm wide, 1 mm long trimming slit 10 where the conductor layer is not provided is formed at that part of the back ground conductor layer 1-*d* overlapping the trimming target part of the internal conductor pattern layer 1-*c*.

Figure 6:
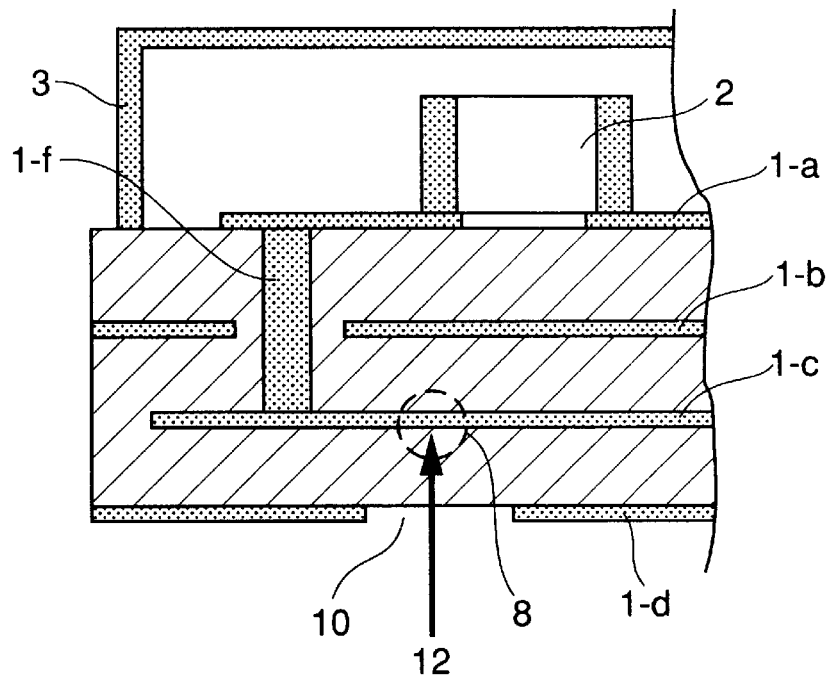
FIG. 6 is an enlarged section view of a trimming target area of the printed circuit board in accordance with Embodiment 1 of the present invention.

FIG. 6 is an enlarged section view of the trimming target area taken on a double-dot dashed line B–B' in FIG. 4. Trimming is accomplished by burning away the internal conductor pattern layer 1-*c* together with the glass epoxy circuit board within the trimming slit 10 by emitting thereto through the trimming slit 10 SHG (second harmonic) light 12 with a 530 nm wavelength from a YAG laser.

The power of laser beam 12 is controlled to a level at which the copper wiring pattern 1-*c* of the internal conductor, and the glass epoxy layer between the trimming slit 10 on the back side of the oscillator to which the laser is emitted and the internal conductor pattern to be trimmed are completely burned out and removed, but at which dielectric defects do not occur in the glass epoxy layer on a side of the conductor pattern opposite to a side to which the laser is incident.

Figure 22:
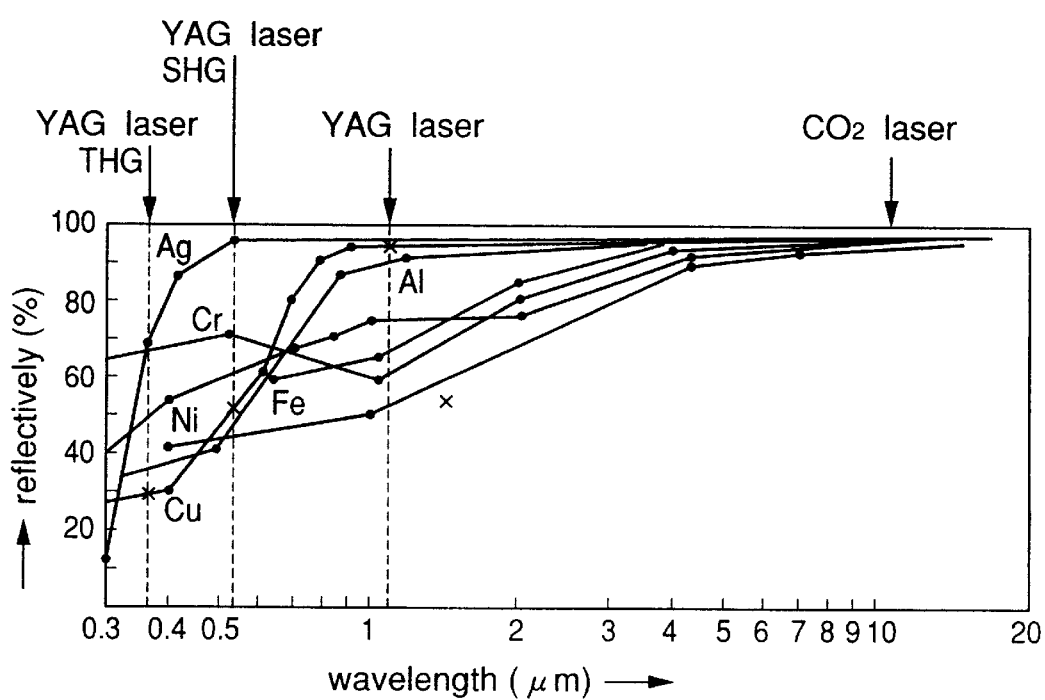
FIG. 22 is a graphical representation showing reflection characteristics of typical metals.

The SHG beam 12 of a YAG laser is used because, as shown in FIG. 22, reflectivity of the internal copper wiring pattern 8 being trimmed to laser light at this wavelength is significantly lower than at the fundamental wavelength (1.06 μm). It is therefore possible to reduce the power used for trimming, as well as damage to peripheral areas not needing trimming, such as by overtrimming to the glass epoxy circuit board layer on the side opposite to the side to which the laser is incident. It is therefore simple to optimally adjust laser power to trim only the required part.

Furthermore, the epoxy resin is melted around a burned out part of the glass epoxy layer from the slit to the internal conductor pattern. This melted resin flows into the trimmed part in a very short time immediately after trimming, thus coating the trimmed part and resetting therein. The sealing effect of this melted resin coating prevents any drop in the moisture resistance properties of the circuit board.

It will also be obvious that to further enhance this sealing effect the slit can be filled with a sealing resin after trimming.

It should be noted that the back side (trimming slit side) surface of the copper forming the internal conductor pattern layer 1-*c* is blackened by an oxidation process before the circuit board layers are laminated together. Reflectivity to laser light is reduced by this coloration, and trimming can thus be accomplished using even less laser power. Combined with using a SHG laser beam as noted above, this makes it even easier to optimally adjust laser power. It will also be obvious that other methods of improving laser absorption can be used, including, for example, darkening said surface using a dye or colorant.

It will be further noted that inductor trimming as described above is accomplished using YAG laser emission to the back side of the module as shown in FIG. 6 after the module is completely assembled. More specifically trimming is accomplished using a function trimming technique in which probes are held to each terminal of the module to monitor the actual oscillation frequency by driving the module while the inductor is trimmed. Trimming thus progresses by moving the trimming point along the slit in the direction of arrow A in FIG. 4 to gradually increase the trimmed length and stop trimming when the desired oscillation frequency is obtained.

It should be further noted that unlike conventional methods whereby the inductor is trimmed from the component mounting surface and then the shield cap is added, the module is already covered with the shield cap 3 when the oscillator is adjusted. High precision trimming and adjustment can therefore be achieved without considering, during the trimming process, a shift in operating characteristics resulting from covering the module with a shield cap after oscillator adjustment.

It will also be obvious that the glass epoxy layer remains in a part of the slit that is not trimmed. The internal conductor pattern layer 1-*c* in this untrimmed area is therefore not exposed, and a drop in moisture resistance can therefore be prevented.

Alternative Version of the First Embodiment

Next an alternative version of the above first embodiment is described below with reference to FIG. 7, a partial section view of the trimmed area in this version.

Figure 7:
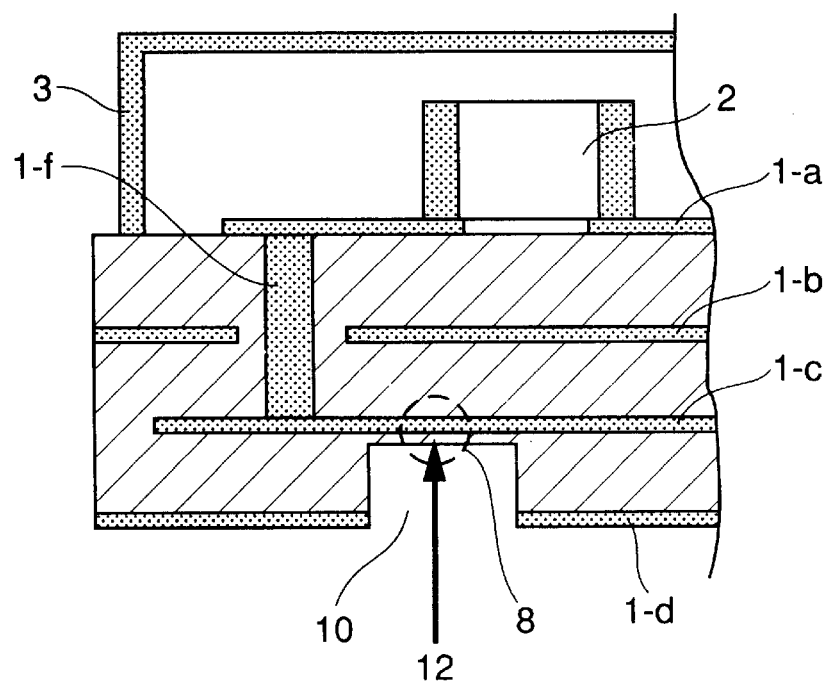
FIG. 7 is an enlarged section view of a trimming target area of a printed circuit board in accordance with an alternative version of Embodiment 1 of the present invention.

As shown in FIG. 7, a trench or depression is formed in the glass epoxy layer exposed at the bottom in the trimming slit 10 formed in the back ground conductor layer 1-*d* in this version. The thickness of the glass epoxy layer in the trimming slit 10 is therefore less than that where there is no trimming slit 10. In this version the glass epoxy layer is approximately 20 μm thick in this trench. It is therefore possible for trimming to be accomplished with even less laser power while achieving an even sharper trimmed shape. Except the formation of this trench, this version is identical to the above described configuration.

The preferred method of manufacturing a circuit board according to this version of the present embodiment is to coat the top (the trimming slit side of back surface) of the internal conductor pattern layer 1-*c* with a 20 μm thick resin film (such as glass epoxy), and then laminate thereto a glass epoxy layer having a through hole formed in the area corresponding to the trimming slit 10. It will be obvious, however, that various other methods can be used, including, for example, chemical methods, such as etching, or mechanical methods to appropriately remove the glass epoxy layer and form a trench or depression after lamination.

When the dielectric layer (such as epoxy resin) on the slit side of the internal conductor where said conductor is to be trimmed is extremely thin as in this version of the present embodiment, great power is not needed to burn out the dielectric layer. As a result, the method of this embodiment can be used even when the dielectric layer in this trimming area is, for example, a low temperature sintered glass ceramic (800° C. to 900° C. sintering temperature). When the low temperature sintered glass ceramic substrate is used, the circuit board can be manufactured by adding an organic plasticizer and binder to the ceramic to produce green sheet, then print the conductors, form a slit, and bond the layers together, and then sinter the resulting structure at one time to obtain a wiring layer comprising an internal conductor pattern and slit as described above. Other steps in the manufacturing method and adjustment method are as described above.

Embodiment 2

Figure 8:
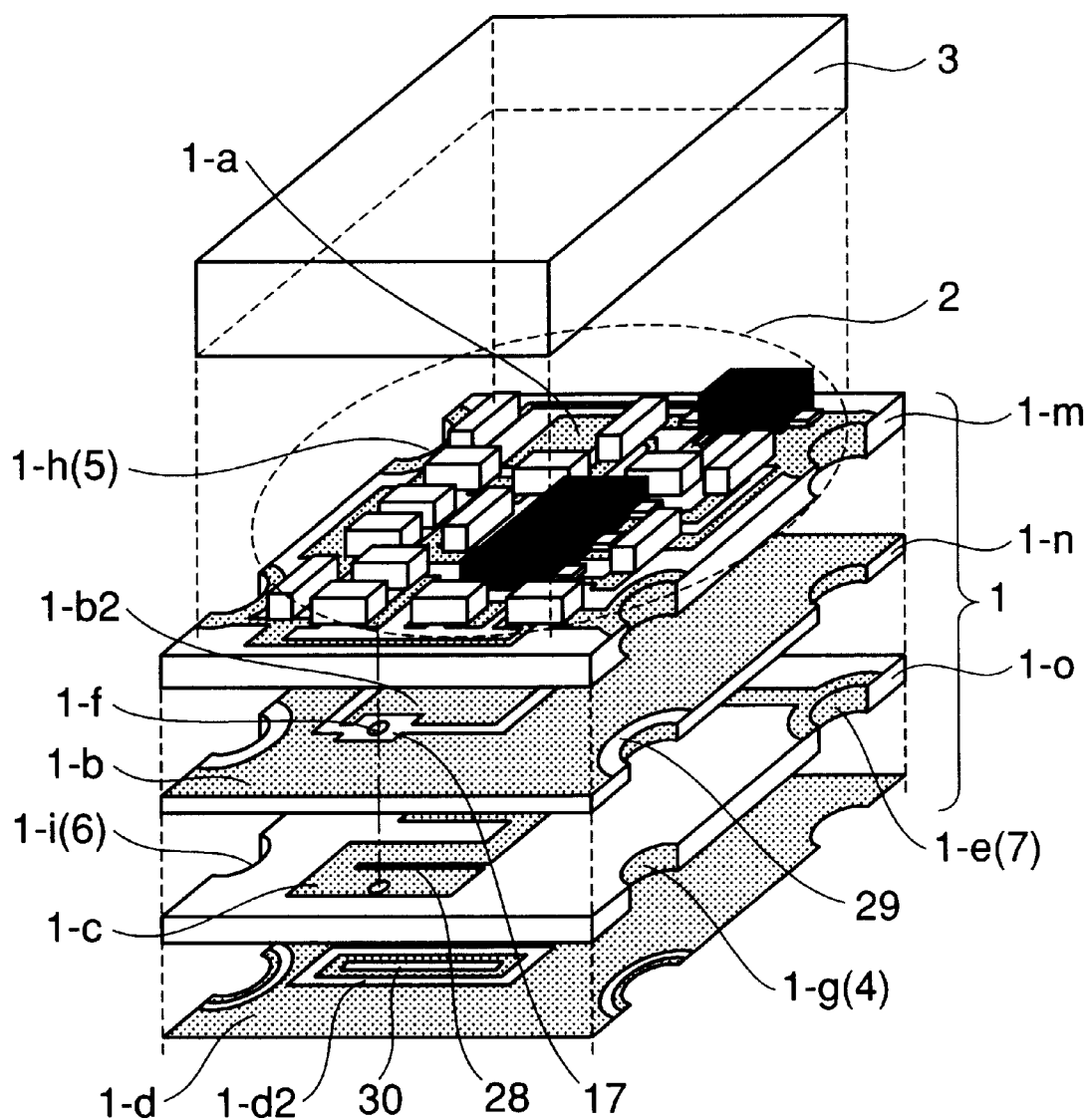
FIG. 8 is a partially exploded perspective view of a voltage control oscillator (VCO) in accordance with Embodiment 2 of the present invention.
Figure 9:
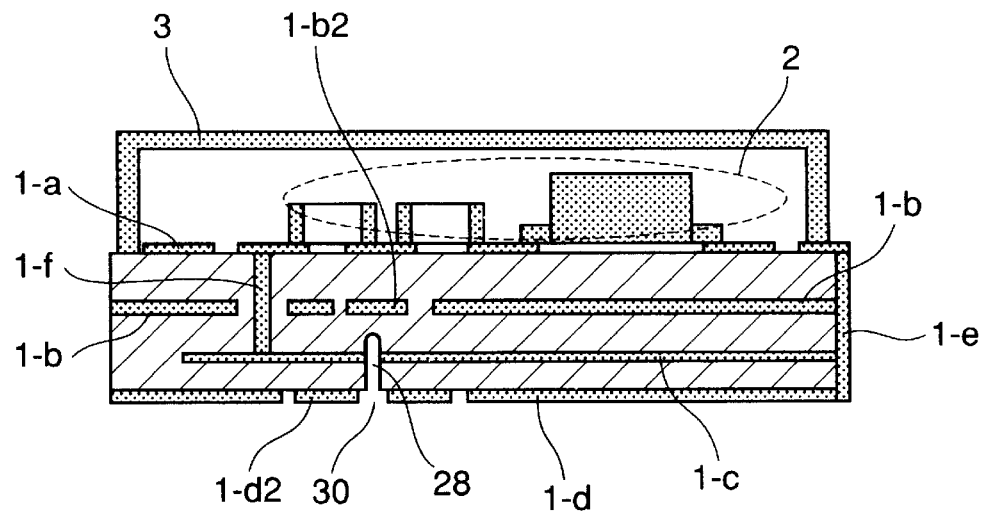
FIG. 9 is a section view of the voltage control oscillator of FIG. 8.

A voltage control oscillator (VCO) having an internal conductor pattern is shown in partially exploded perspective view in FIG. 8 as a second preferred embodiment of the present invention. FIG. 9 is a section view of the same.

As shown in FIG. 8 and FIG. 9, this VCO module M comprises surface mounted components 2 including chip resistors, chip capacitors, transistors, variable capacitor diodes and the like mounted by reflow soldering as oscillation circuit components on the surface of a glass epoxy (resin) copper printed circuit board 1 and covered by a shield cap 3 made from shaped metal sheet.

The circuit board 1 is a multilayer circuit board having four layers: a front conductor pattern surface (layer) 1-a to which the surface mounted components are mounted, and a strip line conductor pattern layer 1-c of the tri-plate structure comprised of an internal conductor pattern layer disposed between an internal ground conductor layer 1-b and a back ground conductor layer 1-d.

The front and back conductor pattern surfaces 1-a and 1-d, and the conductor pattern layer 1-c forming the internal inductor layer are each approximately 20 μm thick; the second internal ground conductor layer 1-b forming the internal ground conductor is approximately 35 μm thick. The substrate 1-m between the front component mounting conductor pattern surface 1-a and internal ground conductor layer 1-b, and a glass epoxy layer 1-o between the internal conductor pattern layer 1-c and back ground conductor layer 1-d, are each approximately 150 μm thick; the substrate 1-n between the internal ground conductor layer 1-b and internal conductor pattern layer 1-c is approximately 200 μm thick.

One end of the internal conductor pattern layer 1-c is disposed at a side of the circuit board, and is grounded by means of a conductor 1-e disposed to the inside wall of a notch (half a through-hole) connecting the conductor pattern surface 1-a, internal ground conductor layer 1-b, and back ground conductor layer 1-d. The other end of the internal conductor pattern layer 1-c is electrically connected by means of a via member 1-f to the surface conductor pattern 1-a through the middle of a window 17 disposed by cutting away a part of the internal ground conductor layer 1-b thereabove.

In addition to the above connections, a Vcc terminal 4, control terminal 5, and a RF output terminal 6 on the conductor pattern surface 1-a, that is, the wiring pattern on the circuit board top, are wired to the circuit board back by way of conductors 1-g, 1-h, and 1-i disposed to the inside wall of notches (half through holes) in the circuit board side.

A circuit diagram of this module is identical to the circuit diagram for the VCO module M according to the first embodiment and shown in FIG. 3.

At transistor Tr, a resistor R, a variable capacitance diode Vc, and a capacitor C in the VCO module M shown in FIG. 3 are surface mounted components 2 mounted on the surface of the above-noted printed circuit board 1. An inductor L of the oscillation circuit is achieved primarily by the internal strip line conductor pattern layer 1-c disposed as a tri-plate structure inside the circuit board.

This VCO module M changes the capacitance of the variable capacitance diode Vc, and changes the oscillation frequency of a RF signal obtained from the RF output terminal 6, by controlling the voltage applied to the control terminal 5 shown in FIG. 3.

However, the oscillation frequency of each individual module varies as a result of differences in the characteristics of individual circuit elements, variations in printed circuit board dimensions, and variations in physical conditions when components are mounted. Therefore, to enable the variable capacitance diode to achieve the design oscillation frequency range by applying a specific control voltage, the inductance of the inductor L disposed as the inductance element of the oscillation circuit is adjusted for each module during the module manufacturing process.

The inductance of inductor L is adjusted by adjusting the length and width of internal conductor pattern layer 1-c forming the inductor L.

FIG. 10 is a plan view of the internal conductor pattern layer 1-c in this exemplary embodiment of the invention from the surface side of the VCO module M. Note that the conductor 1-e side of the internal conductor pattern layer 1-c in the circuit board notch is grounded by way of the circuit board side, and the internal conductor pattern layer 1-c is further connected to other oscillator components 2 mounted on the circuit board surface by way of the via member 1-f.

The electrical length of this conductor can be increased by approximately 2α, and the conductor width can be decreased, by trimming the conductor at the part indicated by the bold line 28 in FIG. 10. The inductance of an inductor comprising a parallel grounded conductor of a distributed constant high frequency circuit can be increased by increasing the electrical length or narrowing the width of the inductor. In this embodiment of the invention, therefore, the initial oscillation frequency of the module is set to a level higher than the design frequency and the inductor is not pretrimmed. The inductor is then trimmed at part 28 shown in FIG. 10 to greatly change the inductance of the inductor L of the oscillator as required to lower the oscillation frequency and thereby adjust the module to the desired oscillation frequency.

In this exemplary embodiment of the invention, the part of the inductor removed by trimming has a width of approximately several ten micrometers, and the length is trimmed 0 to 1 mm.

Figure 11:
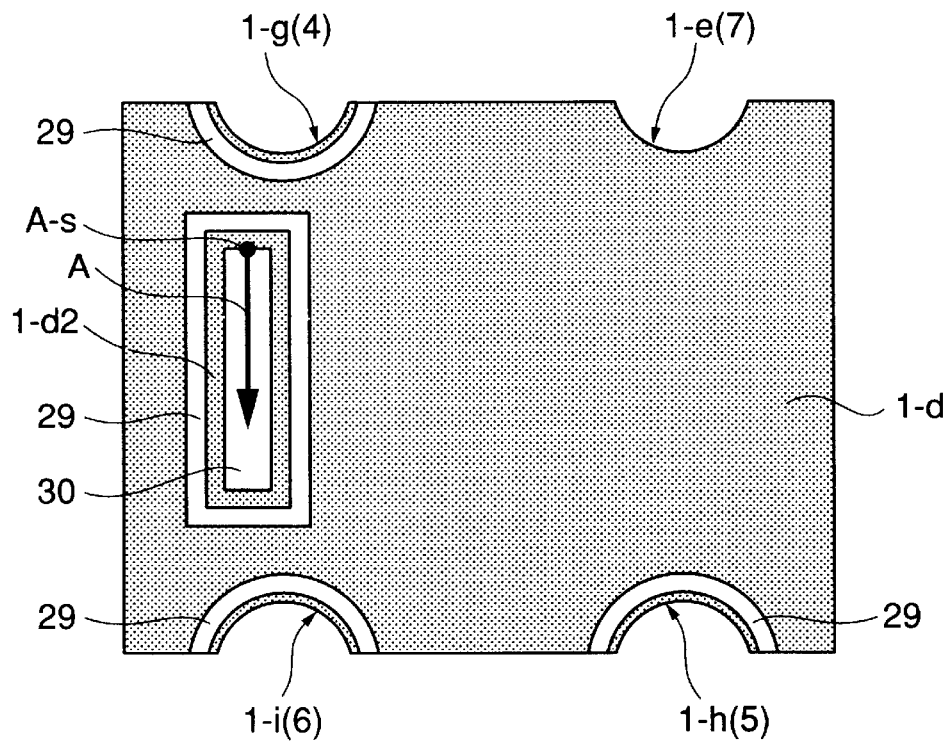
FIG. 11 is a bottom view of the printed circuit board of FIG. 10.

FIG. 11 is a plan view of this VCO module M from the back. Except for the Vcc terminal 4, control terminal 5, RF output terminal 6, and surrounding dielectric bands 29, the major part of the back is covered by the ground conductor layer 1-d. A 200 μm wide, 1 mm long trimming slit 30 where the conductor layer is not provided is formed at a part of the back ground conductor layer 1-d overlapping the trimming target part of the internal conductor pattern layer 1-c. Note, further, that a conductor 1-d2 in the area where the slit is formed is electrically isolated by means of a dielectric body 29 from the surrounding conductor 1-d.

Figure 12:
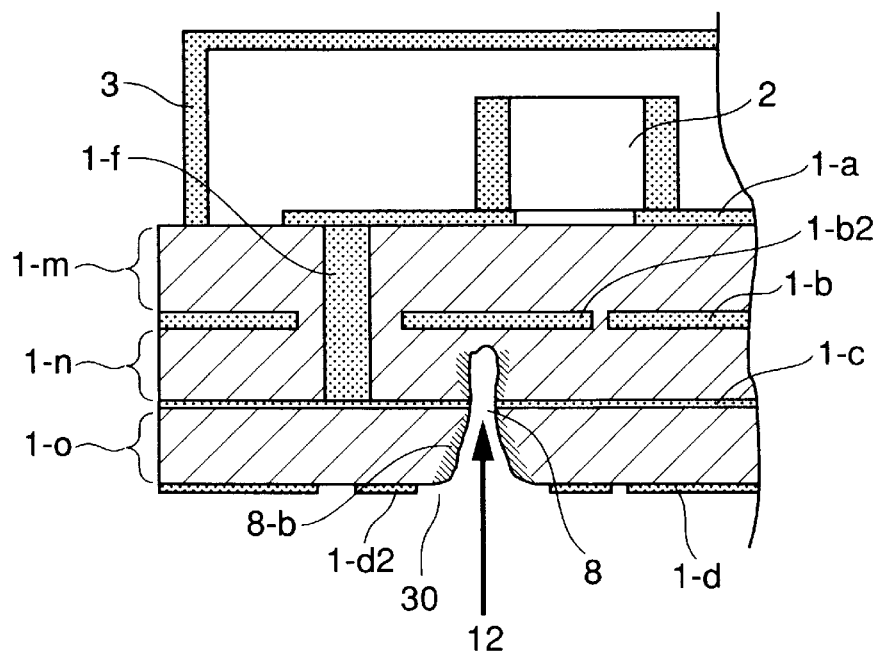
FIG. 12 is an enlarged section view (B–B' section view of FIG. 10) of a trimming target area of the printed circuit board in accordance with Embodiment 2 of the present invention.

FIG. 12 is an enlarged section view of the trimming target area taken on a double-dot dashed line B–B' in FIG. 10. Trimming is accomplished by burning away the internal conductor pattern layer 1-c together with the glass epoxy layer 1-o between the trimming slit 30 and the layer 1-c by emitting thereto a 1.06 μm wavelength YAG laser 12 through the trimming slit 30.

The power of laser beam 12 is controlled to a level at which the copper wiring pattern of the internal conductor pattern layer 1-c, and the glass epoxy layer 1-o between the trimming slit 30 on the back side of the oscillator to which the laser is incident and the internal conductor pattern 1-c to be trimmed are completely burned out and removed, and at which trimming stops in the glass epoxy substrate 1-n on a back side of said internal conductor pattern opposite to the laser incidence side.

The epoxy resin of the glass epoxy layer 1-o around a channel 8 formed by this trimming step on the slit side of the internal conductor pattern is melted and burned by heat transmitted to the area around the laser emission spot, and the width of the resulting channel is thus approximately twice the spot diameter. Carbonized epoxy resin 8-b may also remain in the area peripheral to the channel 8 to become a conductor due to moisture absorption, producing the danger of shorting the edge of the slit 30 and the trimmed part of the internal conductor. In this embodiment, however, the width of the slit 30 is 200 μm or four times the 50 μm diameter of the laser spot, thus reducing the danger of contact between the edge part of the slit 30 and the open edge part of the slit formed by trimming.

Furthermore, the back conductor 1-d2 in which the slit 30 is formed is electrically isolated from the surrounding back ground conductor layer 1-d by means of a dielectric band 29 (see FIG. 11). This dielectric band 29 minimizes the effect on oscillator performance of any short that might occur between the slit edge part and the trimmed part of the internal conductor.

Trimming is more specifically accomplished using a function trimming technique in which probes are held to each terminal of the module during the trimming process to monitor the oscillation frequency while operating the module and trimming the conductor. As shown in FIG. 10 and FIG. 11, the point to which the laser beam 12 spot is emitted is first positioned to a starting point A-s at one end of the slit 30 on the back side. Trimming then progresses while moving the spot along the slit in the direction of arrow A to increase the trimmed length and stop trimming when the desired oscillation frequency is obtained.

Figure 16:
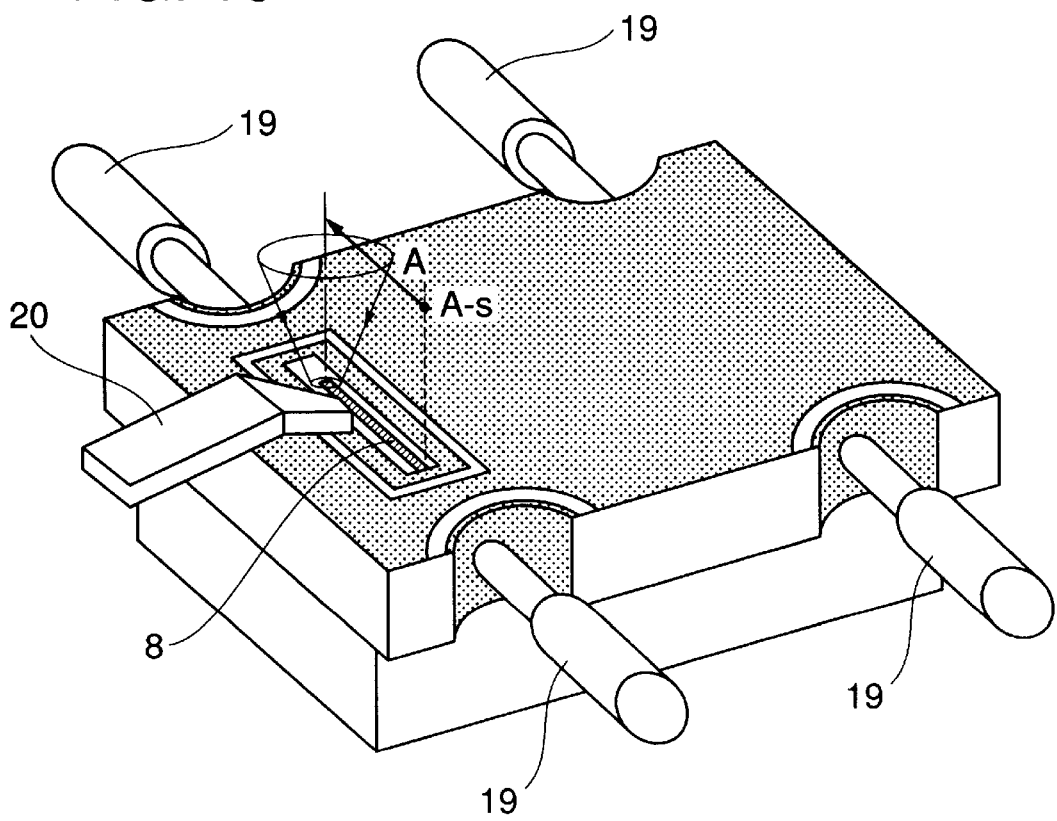
FIG. 16 is a perspective view illustrating a trimming process in accordance with the present invention.
Figure 17:
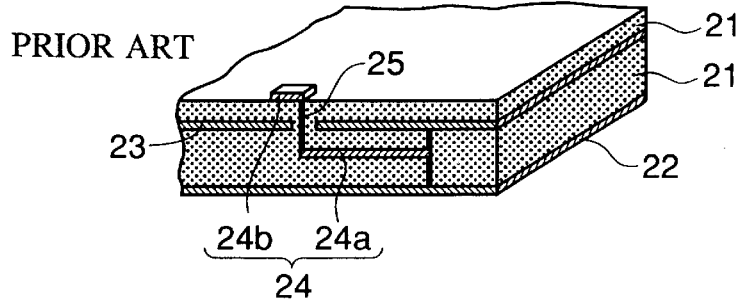
FIG. 17 is a perspective view illustrating the construction of a conventional oscillator.
Figure 18:
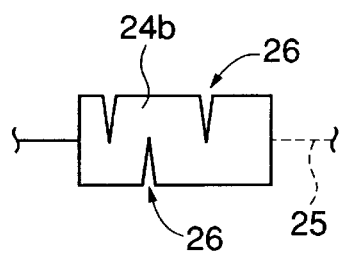
FIG. 18 is a view illustrating a trimmed part of an electrode of the oscillator of FIG. 17.
Figure 19:
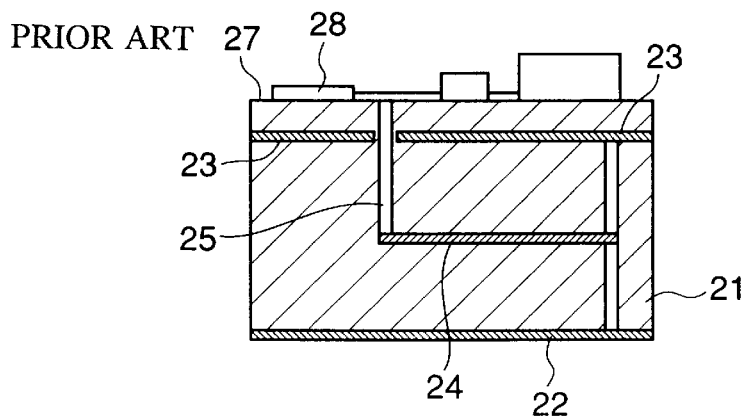
FIG. 19 is a section view illustrating the construction of a conventional oscillator.
Figure 20:
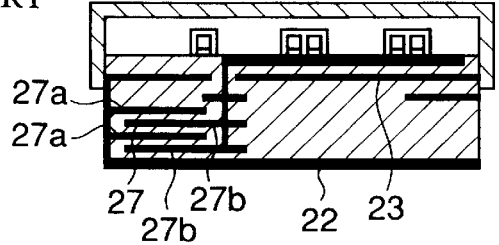
FIG. 20 is a section view illustrating the construction of a conventional oscillator.
Figure 21:
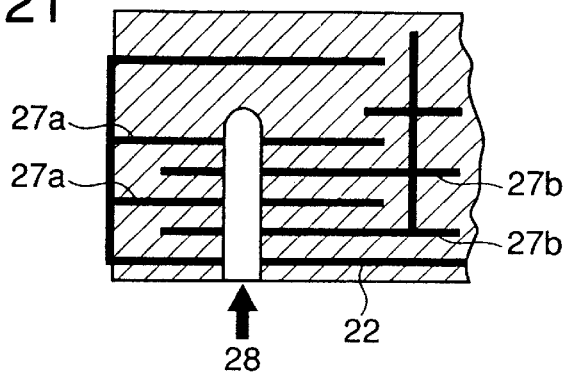
FIG. 21 is a detailed section view of a trimmed part of the oscillator of FIG. 20.

It should be further noted that during an actual function trimming process probes 19 are set to each of the module terminals, and a heat sink 20 contacts the back conductor 1-d2 surrounding the slit 30 to which the laser is emitted, as shown in FIG. 16. This heat sink 20 is made from copper, aluminum, or other material with high thermal conductivity. The heat sink 20 thus dissipates heat from the trimming operation, and thereby prevents damage to the glass epoxy substrate resulting from heat transmission to the surrounding area, as well as such other problems highly likely to occur near the trimmed area, such as remelting solder points on the circuit board and shield cap close to the trimming area.

When the electrical length is increased by cutting a slot in the conductor pad as shown in FIG. 10, trimming starting point A-s is outside the conductor pattern 1-c of the internal inductor, and trimming progresses where the internal conductor is not present until the laser spot advances to where the internal conductor is located. This is shown as distance β in FIG. 10.

FIG. 13 is an enlarged section view of the trimming target area taken on a double-dot dashed line C–C' in FIG. 10. The reflectivity of the internal copper conductor being trimmed using a YAG laser (1.06 μm wavelength) in the present embodiment is extremely high (greater than 90%), and the major portion of the emitted laser power is spent trimming the conductor layer. Therefore, when the conductor layer for the internal inductor, i.e., the trimming target, is not present, the laser passes through the glass epoxy layer 1-n in the trimming area as shown in FIG. 13, and reaches a second internal conductor 1-b2 one layer therebelow as seen from the laser emission side. However, this second internal conductor layer (1-b and 1-b2) is approximately 1.75 times the thickness of the internal inductor 1-c (the trimming target), and the laser spot therefore does not puncture this second internal conductor layer.

If laser power fluctuates, substrate layer thickness varies, or other conditions allow the laser to pass through substrate 1-n when trimming the internal inductor layer 1-c target (FIG. 12), this second internal conductor layer 1-b functions as a blocking layer stopping the laser spot. It is therefore possible to prevent such worst-case problems as the laser cutting all the way through to the front surface of the circuit board.

If trimming progresses to a second conductor layer as described above, shorting between the internal inductor 1-c and back slit edge, as well as shorting between the second internal conductor layer 1-b and the internal inductor 1-c, can occur as a result of the residual carbonized resin 8-b. In the present embodiment, the major part of the second conductor layer 1-b is, in combination with the back ground conductor layer 1-d, a ground conductor layer for forming an internal inductor of the tri-plate structure in conjunction with the internal conductor pattern layer 1-c. However, that part overlaid by the back trimming slit 10 and potentially trimmed forms structure 1-b2 electrically isolated from the ground conductor 1-c by way of a dielectric band 9. As a result, in the event a short occurs, the effect on oscillator performance can be minimized.

It will be further noted that inductor trimming as described above is accomplished using YAG laser emission to the back side of the module after the module is completely assembled. Unlike conventional methods whereby the inductor is trimmed from the component mounting surface and then the shield cap is added, high precision trimming and adjustment can be achieved without considering, during the trimming process, a shift in operating characteristics resulting from covering the module with the shield cap after oscillator adjustment.

It should be yet further noted that the trimming channel 8 can be sealed by filling with epoxy resin, for example, after trimming is completed to prevent entry of foreign material to the channel 8 or moisture absorption by the residual carbonized resin 8-b.

First Alternative Version of the Second Embodiment

Figure 14:
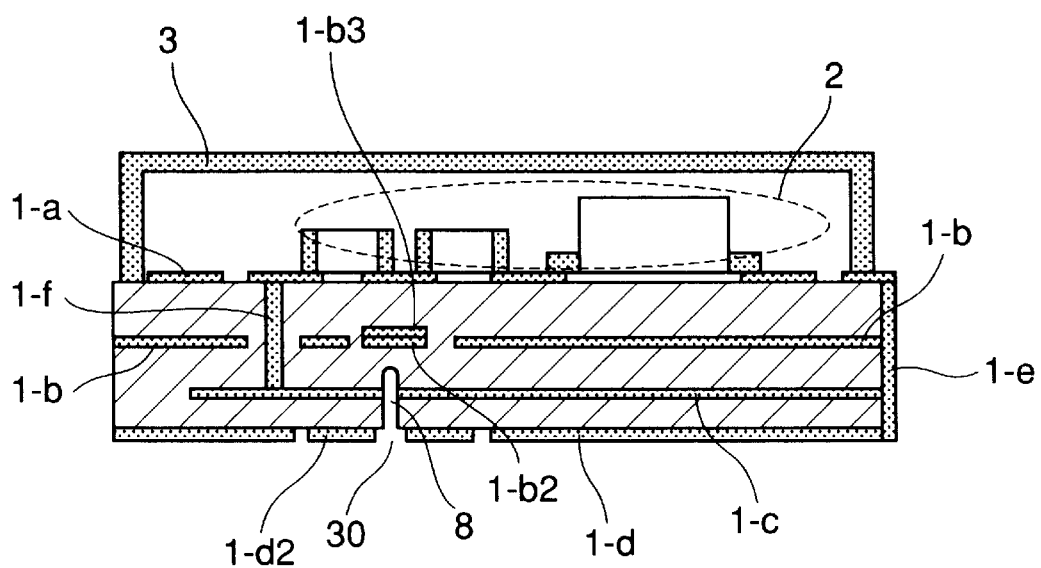
FIG. 14 is a section view of a voltage control oscillator in accordance with a first alternative version of Embodiment 2 of the present invention.

Next a first alternative version of the above second embodiment is described below with reference to FIG. 14, a section view of a VCO module M according to this version.

In this version the second internal conductor layer 1-b in the above-described second embodiment is approximately 20 μm thick, the same thickness as the internal inductor 1-c. As in the second embodiment above, the second internal conductor layer overlaying the trimming slot 30 of this alternative version is a land-type pattern 1-b2 electrically isolated from the internal ground conductor occupying the greater part of the same layer. However, an additional copper foil pad 1-b3 of the same 20 μm thickness as the land part 1-b2 is formed bonded to the back side of the land pattern part 1-b2 relative to the direction of laser emission. The thickness of the second conductor layer in this area is thus approximately twice the thickness of the internal inductor 1-c targeted for trimming. It is therefore possible to achieve the same blocking effect to overtrimming in the depth direction that is achieved by making the entire second internal conductor layer thicker than the trimming target.

The thickness of this second conductor layer land part 1-b2 overlaying the trimming target is preferably increased in this alternative version by bonding copper foils 1-*b* and 1-*c* to both sides of a glass epoxy core substrate 1-*n*; etching or otherwise forming appropriate internal ground conductor layer (second internal conductor layer) and internal inductor layer patterns in said copper foil layers; a bonding copper foil 1-*b*3 to conductor land part 1-*b*2 on the side where the second internal conductor layer is formed; and then bonding a glass epoxy sheet to both sides of the resulting core substrate to form glass epoxy layers 1-*m* and 1-*o* in manufacturing process of the laminate substrate 1. It is also possible, however, to increase the thickness by printing a copper layer to the corresponding location instead of bonding copper foil 1-*b*3 thereto.

Further alternatively, the second internal conductor layer 1-*b* can be formed on the opposite side of the core substrate 1-*n* to which the glass epoxy sheet 1-*m* is bonded (that is, the front surface opposite the side to which the trimming laser is emitted), with the copper foil 1-*b*3 then applied to or printed onto the land part 1-*b*2 and bonded to the core substrate. In this case the thickness of the land part of the second conductor layer in the trimming target area is increased to the back of the circuit board, that is, to the side to which the laser is emitted. This is opposite the direction of thickness increase shown in FIG. 14.

It should be noted that the material used for the layer 1-*b*3 or the foil bonded to the land part 1-*b*2 of the second internal conductor layer shall not be limited to copper as used above, and can be various metals with high reflectivity to the YAG laser used for trimming.

Other aspects of the configuration and operation of this alternative version of the present embodiment are as noted in the second embodiment above.

Second Alternative Version of the Second Embodiment

Figure 15:
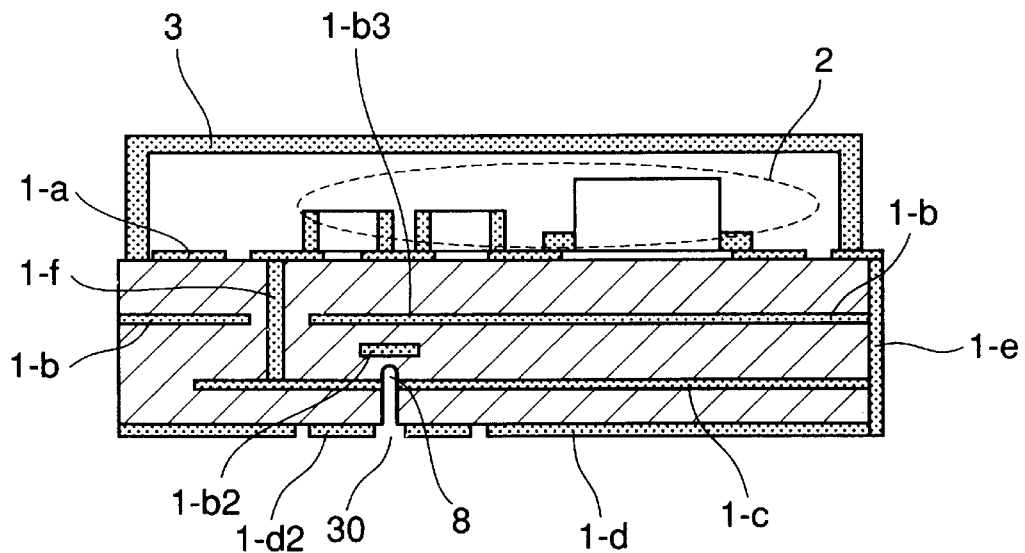
FIG. 15 is a section view of a voltage control oscillator in accordance with a second alternative version of Embodiment 2 of the present invention.

A second alternative version of the above second embodiment is described next. below with reference to FIG. 15, a section view of a VCO module M according to this version.

The internal ground conductor pattern 1-*b* and land part 1-*b*2 isolated therefrom are formed in the same surface in the second embodiment and first alternative version thereof as described above. In this second alternative version, however, second conductor layer 1-*b*2 overlapping the trimming target and providing a blocking action to depthwise overtrimming is formed in a layer separate from the internal ground conductor layer 1-*b* which, in conjunction with the back ground conductor layer 1-*d*, forms an internal inductor element of the tri-plate structure with the internal conductor layer 1-*c*.

As in the second embodiment and preceding first alternative version thereof, the second internal conductor 1-*b*2 backing the trimming target in this second version is isolated from the ground and all other components of the oscillation circuit. This second version can therefore also effectively suppress the danger of the above-described problems arising from shorting. Furthermore, although the circuit board thickness is slightly greater, a more stable oscillation characteristic can be achieved because as in the second embodiment and preceding first alternative version thereof a void will not occur in the internal ground conductor layer 1-*b* where it overlaps the trimming target.

Other aspects of the configuration and operation of this alternative version of the present embodiment are as noted in the second embodiment above.

As described above, an inductor element of an oscillator module can be trimmed inside a circuit board by way of a slit or pinhole in the ground conductor by way of the present invention. It is therefore not necessary to provide a conductor trimming pad on the component mounting surface of the circuit board, and an even smaller oscillator (module) can thus be achieved.

Trimming is further accomplished through a slit or pinhole in part of a ground conductor covering the major part of the back surface of the circuit board. Shielding on the circuit board back is therefore substantially maintained, and it is not necessary to provide a new shield case on said back.

A drop in moisture resistance is also prevented in the part where trimming is not accomplished, and high reliability can be achieved, because the internal conductor is not exposed.

Although the present invention has been described in connection with the preferred embodiments thereof with reference to the accompanying drawings, it is to be noted that various changes and modifications will be apparent to those skilled in the art. Such changes and modifications are to be understood as included within the scope of the present invention as defined by the appended claims, unless they depart therefrom.

What is claimed is:

1. An oscillator comprising:
   a circuit board having a dielectric layer therein;
   an oscillator circuit comprising a plurality of components and an inductor element, the plurality of components being mounted on a front surface of the circuit board, and at least a part of the inductor element being internally disposed in the dielectric layer;
   a shield cap covering the front surface of the circuit board; and
   a back conductor covering a major part of a back surface of the circuit board;
   wherein the back conductor has a slit or pinhole which allows the dielectric layer and the internally disposed part of the inductor element to be partially cut by a laser beam passing through the slit or pinhole for adjustment of an oscillator characteristic.

2. The oscillator according to claim 1, wherein the dielectric layer is formed primarily of an organic material.

3. The oscillator according to claim 1, wherein the dielectric layer has a trench or depression for facilitating cutting by the laser beam in a place where the dielectric layer is exposed through the slit or pinhole of the back conductor.

4. An oscillator, comprising:
   a circuit board having a dielectric layer therein;
   an oscillator circuit comprising a plurality of components and an inductor element, the plurality of components being mounted on a front surface of the circuit board,
   wherein at least a part of the inductor element is internally disposed in the dielectric layer; and
   a back conductor covering a major part of a back surface of the circuit board,
   wherein the back conductor has a slit or pinhole which allows the dielectric layer and the internally disposed part of the inductor element to be partially cut by a laser beam passing through the slit or pinhole for adjustment of an oscillator characteristic,
   wherein the inductor element is colored on a surface of the internally disposed part thereof for reducing reflection of the laser beam.

5. The oscillator according to claim 1, wherein the back conductor is a ground conductor.

6. An oscillator, comprising:
   a circuit board having a dielectric layer therein;
   an oscillator circuit comprising a plurality of components and an inductor element, the plurality of components being mounted on a front surface of the circuit board, wherein at least a part of the inductor element is internally disposed in the dielectric layer;

a back conductor covering a major part of a back surface of the circuit board; and a laser blocking conductor internally disposed between the inductor element and the front surface of the circuit board, but in the dielectric layer, wherein the back conductor has a slit or pinhole which allows the dielectric layer and the internally disposed part of the inductor element to be partially cut by a laser beam passing through the slit or pinhole for adjustment of an oscillator characteristic.

7. The oscillator according to claim 6, wherein the laser blocking conductor has a larger thickness than the inductor element.

8. The oscillator according to claim 6, wherein the back conductor is a ground conductor and the laser blocking conductor is electrically isolated from the oscillator circuit including the ground conductor.

9. The oscillator according to claim 6, wherein the slit or pinhole has a width or diameter at least twice as large as the width or diameter of a beam spot formed by the laser beam.

10. The oscillator according to claim 6, wherein the back conductor comprises a ground area and a non-ground area which includes the slit or pinhole and is electrically isolated from the oscillator circuit including the ground area.

11. A method for adjusting an oscillation characteristic of an oscillator comprising a circuit board having a dielectric layer therein; an oscillator circuit comprising a plurality of components and an inductor element, the plurality of components being mounted on a front surface of the circuit board, and at least a part of the inductor element being internally disposed in the dielectric layer; and a back conductor covering a major part of a back surface of the circuit board, the method comprising:

forming a slit or pinhole in the back conductor;

cutting the dielectric layer and the internally disposed part of the inductor element by a laser beam through the slit or pinhole; and placing a shield cap over the front surface of the circuit board before said step of cutting the dielectric layer and the internally disposed part of the inductor element.

12. The method according to claim 11, wherein a second or higher harmonic of a YAG laser is used as the laser beam.

13. A method for adjusting an oscillation characteristic of an oscillator comprising a circuit board having a dielectric layer therein, an oscillator circuit comprising a plurality of components and an inductor element, the plurality of components being mounted on a front surface of the circuit board, and at least a part of the inductor element being internally disposed in the dielectric layer, and a back conductor covering a major part of a back surface of the circuit board, the method comprising:

forming beforehand a slit or pinhole in the back conductor; and partially cutting the dielectric layer and the internally disposed part of the inductor element by a laser beam through the slit or pinhole, wherein, when said at least a part of the inductor element that is internally disposed is partially cut through the slit or pinhole, a heat sink is contacted with the back conductor in the vicinity of the slit or pinhole.

14. The method according to claim 13, wherein the back conductor comprises a ground area and a non-ground area which includes the slit or pinhole and is electrically isolated from the oscillator circuit including the ground area, and the heat sink is contacted with the non-ground area.

15. The oscillator of claim 1, wherein the circuit board is a multi-layer circuit board.

16. The oscillator of claim 1, wherein the circuit board is a four-layer circuit board.

17. The method of claim 11, wherein the circuit board is a multi-layer circuit board.

18. The method of claim 11, wherein the circuit board is a four-layer circuit board.

19. An oscillator, comprising:

a circuit board having a dielectric layer therein;

an electronic circuit having a portion thereof surface mounted on a first surface of the circuit board;

a resonant circuit coupled to the electronic circuit and having an inductive element within the dielectric layer;

a conductive layer on a second surface of the circuit board opposing the first surface, the conductive layer having an opening which exposes a portion of the dielectric layer and a portion of the inductive element to a laser beam which is passed through the opening to adjust an operating frequency of the oscillator, wherein at least said exposed portion of the inductive element is adapted to reduce a reflection of the laser beam therefrom.

20. The oscillator of claim 19, further comprising a trench in said dielectric layer aligned with said opening in said conductive layer.

21. The oscillator of claim 19 further comprising a laser blocking conductor located between said first and said second surfaces of said circuit board.

22. The oscillator of claim 21, wherein said laser blocking conductor is located between said first surface of said circuit board and said inductive element.

23. The oscillator of claim 19, wherein the laser beam is a second or higher harmonic wavelength of a YAG laser.

* * * * *